US012200863B2

United States Patent
Li et al.

(10) Patent No.: US 12,200,863 B2
(45) Date of Patent: Jan. 14, 2025

(54) PRINTED CIRCUIT BOARD AND WIRE ARRANGEMENT METHOD THEREOF

(71) Applicant: Celestica Technology Consultancy (Shanghai) Co. Ltd, Shanghai (CN)

(72) Inventors: Jing Li, Shanghai (CN); Haiju Huang, Shanghai (CN); Chenxia Feng, Shanghai (CN); Chunmei Wu, Shanghai (CN)

(73) Assignee: Celestica Technology Consultancy (Shanghai) Co. Ltd, Shanghai (CN)

( * ) Notice: Subject to any disclaimer, the term of this patent is extended or adjusted under 35 U.S.C. 154(b) by 307 days.

(21) Appl. No.: 17/834,874

(22) Filed: Jun. 7, 2022

(65) Prior Publication Data

US 2023/0164916 A1     May 25, 2023

(30) Foreign Application Priority Data

Nov. 25, 2021 (CN) .......................... 202111414484.0
Nov. 25, 2021 (CN) .......................... 202122914470.7

(51) Int. Cl.
     *H05K 1/11*      (2006.01)
     *H05K 1/02*      (2006.01)
     *H05K 1/18*      (2006.01)

(52) U.S. Cl.
     CPC .......... *H05K 1/115* (2013.01); *H05K 1/0298* (2013.01); *H05K 1/18* (2013.01); *H05K 2201/09518* (2013.01); *H05K 2201/09527* (2013.01); *H05K 2203/02* (2013.01)

(58) Field of Classification Search
     CPC ........ H05K 1/0298; H05K 1/115; H05K 1/18; H05K 2201/09518; H05K 2201/09527; H05K 2203/02
See application file for complete search history.

(56) References Cited

U.S. PATENT DOCUMENTS

| | | | |
|---|---|---|---|
| 7,540,744 B1* | 6/2009 | Minich | H05K 1/18 439/65 |
| 2004/0108137 A1* | 6/2004 | Vetter | H01R 12/523 174/262 |
| 2008/0059685 A1* | 3/2008 | Hsu | H05K 1/0295 710/314 |
| 2010/0012365 A1* | 1/2010 | Hsieh | H05K 1/0295 29/832 |
| 2019/0208618 A1* | 7/2019 | Wen | H05K 3/043 |

* cited by examiner

*Primary Examiner* — Nathan Milakovich
(74) *Attorney, Agent, or Firm* — IPRTOP LLC

(57) ABSTRACT

The present disclosure provides a printed circuit board and a wire arrangement method thereof. The printed circuit board includes a packaged chip and at least two connectors, wires of the packaged chip that are connected to different connectors are distributed on different board layers; and when the packaged chip is connected to one of the connectors, a via is backdrilled to form a high-speed path from the packaged chip to the connector, and copper walls of board layers corresponding to other connectors are drilled out. The wires of the packaged chip that are connected to different connectors are distributed on different board layers. When the packaged chip is connected to one of the connectors, according to backdrilling of different depths, the via is backdrilled to form a high-speed path from the packaged chip to the connector, and copper walls of board layers corresponding to other connectors are drilled out.

10 Claims, 4 Drawing Sheets

PRINTED CIRCUIT BOARD AND WIRE ARRANGEMENT METHOD THEREOF

CROSS REFERENCE TO RELATED APPLICATIONS

The present application claims the benefit of priority to Chinese Patent Application No. CN 2021114144840, entitled "PRINTED CIRCUIT BOARD AND WIRE ARRANGEMENT METHOD THEREOF", filed with CNIPA on Nov. 25, 2021, Chinese Patent Application No. CN 2021229144707, entitled "PRINTED CIRCUIT BOARD", filed with CNIPA on Nov. 25, 2021, the contents of which are incorporated herein by reference in their entireties.

FIELD OF THE TECHNOLOGY

The present disclosure relates to the field of electronic circuit technologies, in particular, to the field of printed circuit board technologies.

BACKGROUND

As shown in FIG. 1, when a packaged chip 110 and two connectors (for example, a connector 120 and a connector 130 shown in FIG. 1) are disposed on a printed circuit board (PCB), signals from the packaged chip 110 to the connector 120 are distributed close to a bottom layer, and signals from the packaged chip 110 to the connector 130 are distributed close to a top layer. A wire 1 is a wire connected from a pad of the connector 120 to a via, and a wire 2 is a wire connected from the packaged chip 110 to a via; and a wire 3 is a wire connected from a via to the connector 130.

Wires on the connector 120 may be connected to another PCB or cable, and wires on the connector 130 may be also connected to another PCB or cable.

How to avoid a problem that a high-speed cable cannot achieve a normal effect due to the foregoing connection manner, to make high-speed cables between the packaged chip 110 and the connector 120 and between the packaged chip 110 and the connector 130 work normally is a technical problem to be resolved by those skilled in the art.

SUMMARY

The present disclosure provides a printed circuit board and a wire arrangement method thereof, to optimize wiring of high-speed cables when one printed circuit board is connected to different connectors.

The printed circuit board includes a packaged chip and at least two connectors. Wires of the packaged chip that are connected to different connectors are distributed on different board layers; and when the packaged chip is connected to one of the connectors, a via is backdrilled to form a high-speed path from the packaged chip to the connector, and copper walls of board layers corresponding to other connectors are drilled out.

In an embodiment of the present disclosure, the connectors include a first connector and a second connector; and a wire from the packaged chip to the first connector is disposed on a first board layer of the printed circuit board, and a wire from the packaged chip to the second connector is disposed on a second board layer of the printed circuit board.

In an embodiment of the present disclosure, when the packaged chip is connected to the first connector, the via is backdrilled to form a high-speed path from the packaged chip to the first connector, and a copper wall of the second board layer is drilled out; and when the packaged chip is connected to the second connector, the via is backdrilled to form a high-speed path from the packaged chip to the second connector, and a copper wall of the first board layer is drilled out.

In an embodiment of the present disclosure, in a case that the first board layer is located below the second board layer: when the packaged chip is connected to the first connector, backdrilling of the via starts from a first layer and ends at a layer above the first board layer, and a copper wall of the second board layer is drilled out, so that the via is backdrilled to form a high-speed path from the packaged chip to the first connector, the first connector remains connected at the via, and the second connector is disconnected at the via; and when the packaged chip is connected to the second connector, backdrilling of the via starts from an $N^{th}$ layer and ends at a layer below the second board layer, and copper walls of the first board layer and a bottom layer of the printed circuit board are drilled out, so that the via is backdrilled to form a high-speed path from the packaged chip to the second connector, the second connector remains connected at the via, and the first connector is disconnected at the via, wherein N is a total quantity of layers of the printed circuit board.

In an embodiment of the present disclosure, in a case that the first board layer is located above the second board layer: when the packaged chip is connected to the second connector, backdrilling of the via starts from a first layer and ends at a layer above the second board layer, and a copper wall of the first board layer is drilled out, so that the via is backdrilled to form a high-speed path from the packaged chip to the second connector, the second connector remains connected at the via, and the first connector is disconnected at the via; and when the packaged chip is connected to the first connector, backdrilling of the via starts from an $N^{th}$ layer and ends at a layer below the first board layer, and copper walls of the second board layer and a bottom layer of the printed circuit board are drilled out, so that the via is backdrilled to form a high-speed path from the packaged chip to the first connector, the first connector remains connected at the via, and the second connector is disconnected at the via, where N is a total quantity of layers of the printed circuit board.

An embodiment of the present disclosure further provides a wire arrangement method of a printed circuit board, including: distributing wires of a packaged chip that are connected to different connectors on different board layers; and when the packaged chip is connected to one of the connectors, backdrilling a via to form a high-speed path from the packaged chip to the connector, and drilling out copper walls of board layers corresponding to other connectors.

In an embodiment of the present disclosure, the connectors include a first connector and a second connector; and a wire from the packaged chip to the first connector is disposed on a first board layer of the printed circuit board, and a wire from the packaged chip to the second connector is disposed on a second board layer of the printed circuit board.

In an embodiment of the present disclosure, when the packaged chip is connected to the first connector, the via is backdrilled to form a high-speed path from the packaged chip to the first connector, and a copper wall of the second board layer is drilled out; and when the packaged chip is connected to the second connector, the via is backdrilled to form a high-speed path from the packaged chip to the second connector, and a copper wall of the first board layer is drilled out.

In an embodiment of the present disclosure, in a case that the first board layer is located below the second board layer: when the packaged chip is connected to the first connector, backdrilling of the via starts from a first layer and ends at a layer above the first board layer, and a copper wall of the second board layer is drilled out, so that the via is backdrilled to form a high-speed path from the packaged chip to the first connector, the first connector remains connected at the via, and the second connector is disconnected at the via; and when the packaged chip is connected to the second connector, backdrilling of the via starts from an $N^{th}$ layer and ends at a layer below the second board layer, and copper walls of the first board layer and a bottom layer of the printed circuit board are drilled out, so that the via is backdrilled to form a high-speed path from the packaged chip to the second connector, the second connector remains connected at the via, and the first connector is disconnected at the via, where N is a total quantity of layers of the printed circuit board.

In an embodiment of the present disclosure, in a case that the first board layer is located above the second board layer: when the packaged chip is connected to the second connector, backdrilling of the via starts from a first layer and ends at a layer above the second board layer, and a copper wall of the first board layer is drilled out, so that the via is backdrilled to form a high-speed path from the packaged chip to the second connector, the second connector remains connected at the via, and the first connector is disconnected at the via; and when the packaged chip is connected to the first connector, backdrilling of the via starts from an $N^{th}$ layer and ends at a layer below the first board layer, and copper walls of the second board layer and a bottom layer of the printed circuit board are drilled out, so that the via is backdrilled to form a high-speed path from the packaged chip to the first connector, the first connector remains connected at the via, and the second connector is disconnected at the via, where N is a total quantity of layers of the printed circuit board.

As described above, the printed circuit board and the wire arrangement method thereof of the present disclosure have the following beneficial effects:

In the present disclosure, the wires of the packaged chip that are connected to different connectors are distributed on different board layers. When the packaged chip is connected to one of the connectors, according to backdrilling of different depths, the via is backdrilled to form a high-speed path from the packaged chip to the connector, and copper walls of board layers corresponding to other connectors are drilled out. In this way, applications of high-speed wires connected to different connectors are met without re-designing the routing of printed circuit boards, thereby reducing costs.

DESCRIPTION OF THE SPECIFIC EMBODIMENTS

Figure 1:
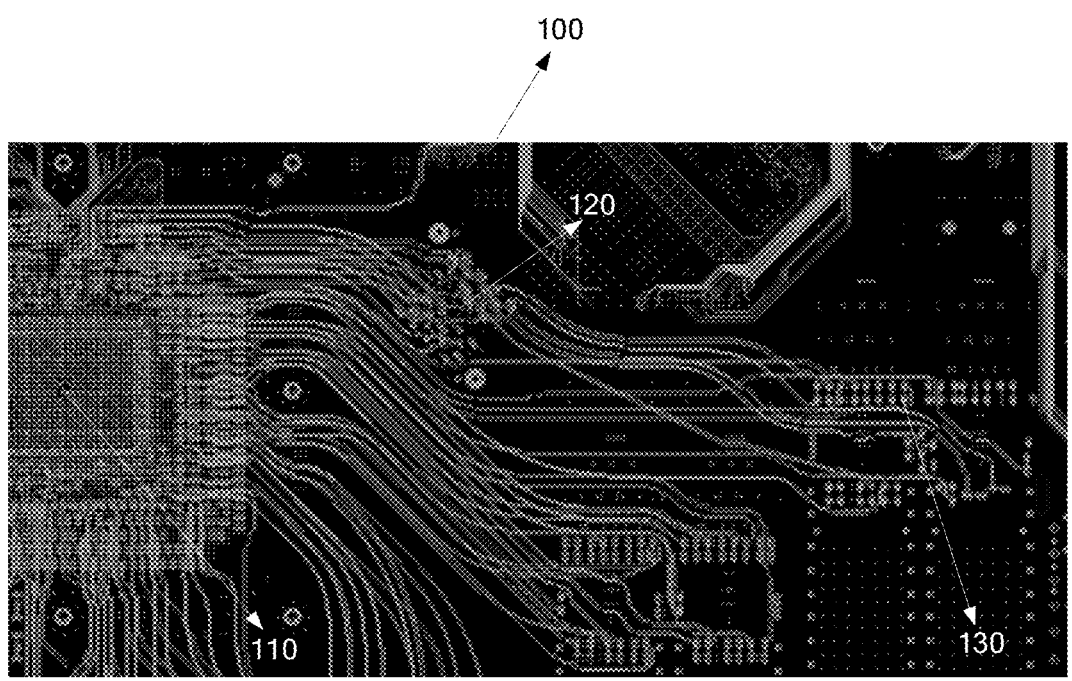
FIG. 1 shows a schematic structural diagram of a printed circuit board with connection regions of two connectors.

The following describes implementations of the present disclosure by using specific embodiments. A person skilled in the art may easily understand other advantages and effects of the present disclosure from the content disclosed in this specification.

Refer to FIGS. 1 to 4. It should be noted that the structures, proportions, sizes, and the like shown in the drawings of this specification, in coordination with the content disclosed in this specification, are only used to help a person skilled in the art to read and understand, and they are not intended to limit the conditions under which the present disclosure can be implemented and therefore have no technical significance. Any modification to the structure, change to the proportional relationship or the adjustment on the size should fall within the scope of the technical content disclosed by the present disclosure without affecting the effects and the objectives that can be achieved by the present disclosure. In addition, the terms such as "upper", "lower", "left", "right", "middle", and "a" mentioned in this specification are also merely for facilitating clear descriptions, but are not intended to limit the scope of implementation of the present disclosure. Without substantially changing the technical content, changes or adjustments of relative relationships thereof should also fall within the scope of implementation of the present disclosure.

An embodiment provides a printed circuit board and a wire arrangement method thereof, to resolve a technical problem that high-speed cables cannot work normally when a printed circuit board is connected to different connectors.

Principles and implementations of the printed circuit board and the wire arrangement method thereof of the embodiments are described below in detail, so that a person skilled in the art can understand the printed circuit board and the wire arrangement method thereof of the embodiments without creative efforts.

As shown in FIG. 1, this embodiment provides a printed circuit board 100, and the printed circuit board includes a packaged chip and at least two connectors.

The packaged chip is packaged by using a ball grid array (BGA) technology or a land grid array (LGA) technology.

Vias of the printed circuit board 100 include two types of vias: via-in-pad plated over (VIPPO) vias and non-VIPPO vias (conventional vias). In this embodiment, VIPPO vias are disposed on a back surface of the printed circuit board 100.

Specifically, in this embodiment, wires of the packaged chip that are connected to different connectors are distributed on different board layers; and when the packaged chip is connected to one of the connectors, a via is backdrilled to form a high-speed path from the packaged chip to the connector, and copper walls of board layers corresponding to other connectors are drilled out.

In the printed circuit board 100 of this embodiment, the wires of the packaged chip that are connected to different connectors are distributed on different board layers. When the packaged chip is connected to one of the connectors, according to backdrilling of different depths, the via is backdrilled to form a high-speed path from the packaged chip to the connector, and copper walls of board layers corresponding to other connectors are drilled out. In this way, applications of high-speed wires connected to two or more connectors are met without preparing two or more printed circuit boards, thereby reducing costs.

Specifically, in this embodiment, the connectors include a first connector and a second connector; and a wire from the packaged chip to the first connector is disposed on a first board layer of the printed circuit board 100, and a wire from the packaged chip to the second connector is disposed on a second board layer of the printed circuit board 100. That is, in the printed circuit board 100 of this embodiment, the wires of the packaged chip that are connected to different connectors are distributed on different board layers.

In this embodiment, when the packaged chip is connected to the first connector, the via is backdrilled to form a high-speed path from the packaged chip to the first connector, and a copper wall of the second board layer is drilled out; and when the packaged chip is connected to the second connector, the via is backdrilled to form a high-speed path from the packaged chip to the second connector, and a copper wall of the first board layer is drilled out.

In this embodiment, in a case that the first board layer is located below the second board layer, when the packaged chip is connected to the first connector, backdrilling of the via starts from a first layer and ends at a layer above the first board layer, and a copper wall of the second board layer is drilled out, so that the via is backdrilled to form a high-speed path from the packaged chip to the first connector, the first connector remains connected at the via, and the second connector is disconnected at the via; and when the packaged chip is connected to the second connector, backdrilling of the via starts from an $N^{th}$ layer and ends at a layer below the second board layer, and copper walls of the first board layer and a bottom layer of the printed circuit board 100 are drilled out, so that the via is backdrilled to form a high-speed path from the packaged chip to the second connector, the second connector remains connected at the via, and the first connector is disconnected at the via, where N is a total quantity of layers of the printed circuit board 100.

Figure 2:
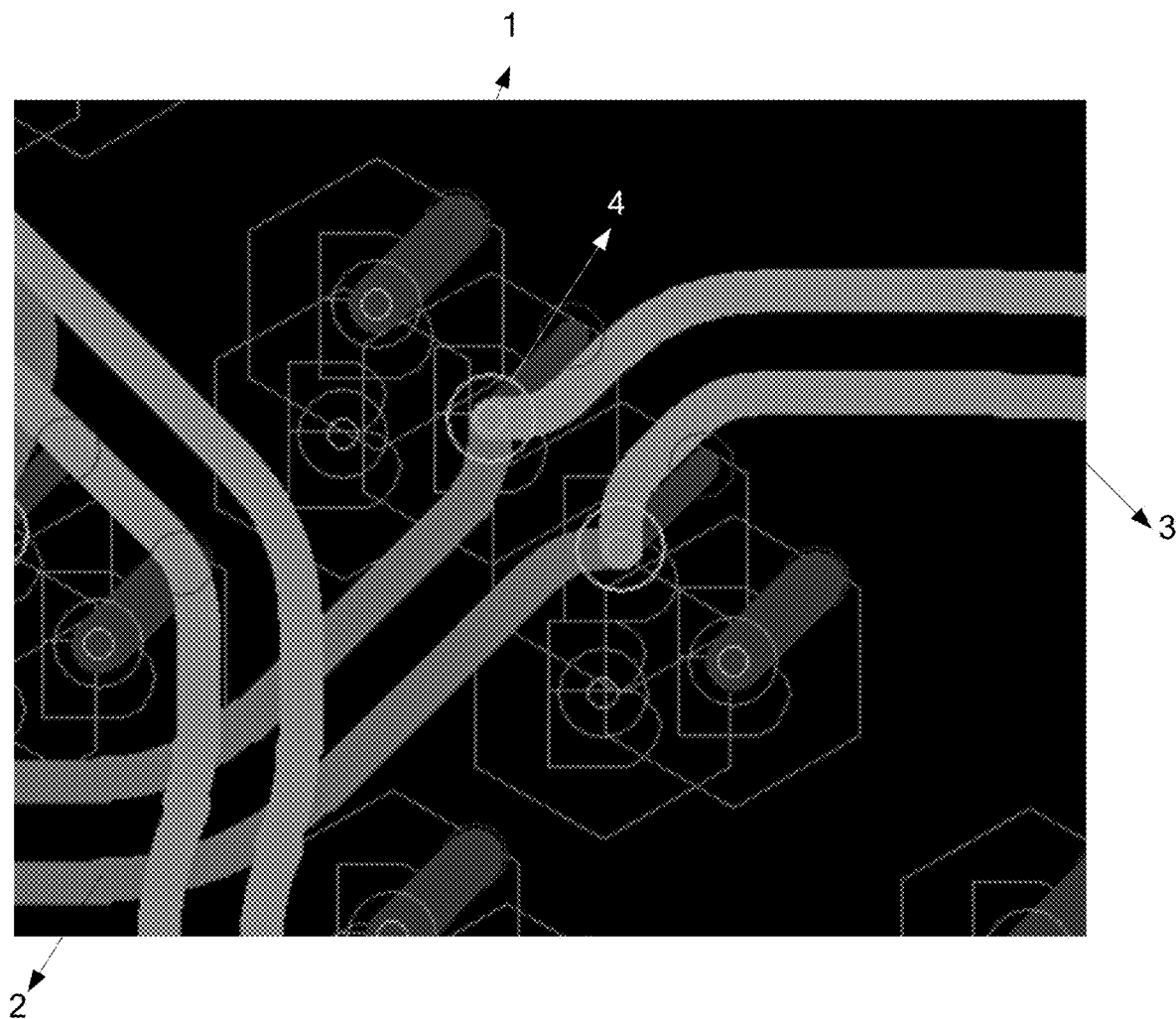
FIG. 2 shows a schematic diagram of wiring connection of a printed circuit board with connection regions of two connectors according to the present disclosure.
Figure 3:
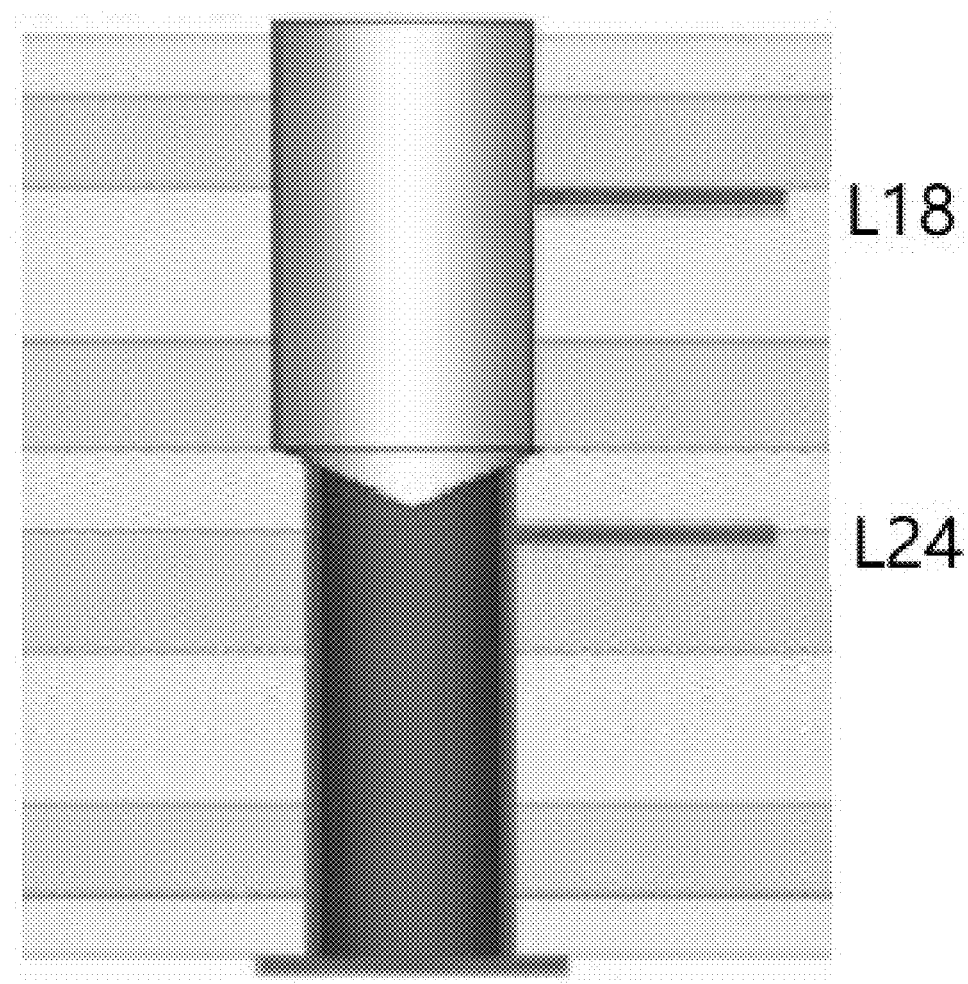
FIG. 3 shows a schematic diagram of an effective backdrilling via of a high-speed path implemented when a packaged chip in a printed circuit board is connected to a first connector according to the present disclosure.
Figure 4:
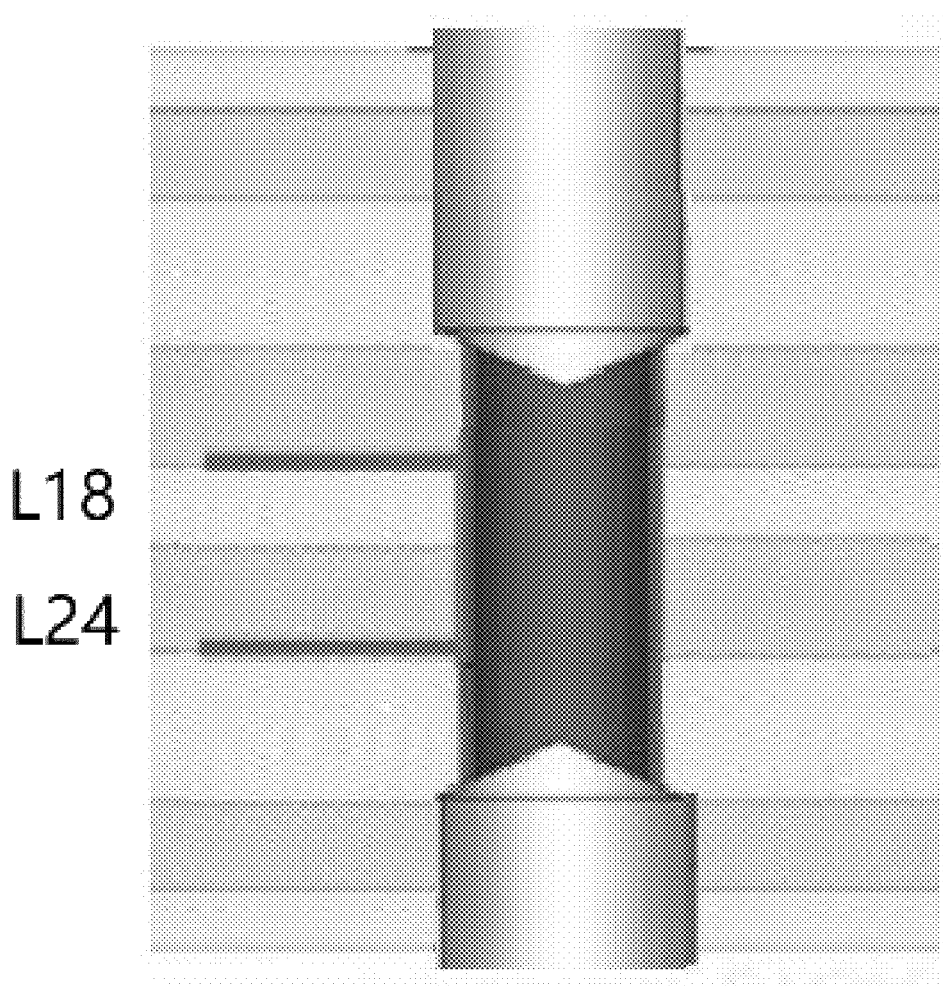
FIG. 4 shows a schematic diagram of an effective backdrilling via of a high-speed path implemented when a packaged chip in a printed circuit board is connected to a second connector according to the present disclosure.

Refer to FIGS. 2 to 4, a description is made below by using an example in which the total quantity N of layers of the printed circuit board 100 is 28.

As shown in FIG. 2, assuming that a wire 2 from the packaged chip to the first connector is on a $24^{th}$ layer, a wire 3 from the first connector to the second connector is on an $18^{th}$ layer, a wire 1 is a wire connecting a via 4 and a pad of the first connector, and the wire 1, the wire 2, and the wire 3 are connected at the via 4.

As shown in FIG. 3, when the packaged chip needs to be connected to the first connector, if a high-speed path from the packaged chip to the first connector is required to be effective, backdrilling needs to start from a first layer and end at a layer above the $24^{th}$ layer, to ensure that the $24^{th}$ layer is not drilled out; a copper wall of the $18^{th}$ layer needs to be drilled out, to ensure that the second connector is disconnected at the via 4, and the wire of the first connector remains connected at the via 4.

As shown in FIG. 4, when the packaged chip needs to be connected to the second connector, if a high-speed path from the packaged chip to the second connector is required to be effective, backdrilling needs to start from a $28^{th}$ layer and end at a layer below the $18^{th}$ layer, to ensures that the $18^{th}$ layer is not drilled out; copper walls of a bottom layer and the $24^{th}$ layer need to be drilled out, to ensure that the first connector is disconnected at the via 4, and the wire of the second connector remains connected at the via 4.

As can be seen from the foregoing descriptions, provided that a layer on which signals are connected from the first connector to the packaged chip is located below a layer on which signals are connected from the first connector to the second connector, different connectors may be selected for mounting by changing a backdrilling manner without any signal quality problem. Therefore, in the printed circuit board 100 of this embodiment, according to backdrilling of different depths, the via 4 is backdrilled to form a high-speed path from the packaged chip to the connector, and copper walls of board layers corresponding to other connectors are drilled out. In this way, applications of high-speed wires connected to two or more connectors are met without preparing two or more printed circuit boards 100.

Accordingly, contrary to a case that the first board layer is located below the second board layer, in this embodiment, in a case that the first board layer is located above the second board layer, when the packaged chip is connected to the second connector, backdrilling of the via starts from a first layer and ends at a layer above the second board layer, and a copper wall of the first board layer is drilled out, so that the via is backdrilled to form a high-speed path from the packaged chip to the second connector, the second connector remains connected at the via, and the first connector is disconnected at the via; and when the packaged chip is connected to the first connector, backdrilling of the via starts from an $N^{th}$ layer and ends at a layer below the first board layer, and copper walls of the second board layer and a bottom layer of the printed circuit board are drilled out, so that the via is backdrilled to form a high-speed path from the packaged chip to the first connector, the first connector remains connected at the via, and the second connector is disconnected at the via, where N is a total quantity of layers of the printed circuit board.

An implementation principle of a backdrilling manner in a case that the first board layer is located above the second board layer is the same as an implementation principle of a backdrilling manner in a case that the first board layer is located below the second board layer, and details are not described herein again.

In addition, this embodiment only makes a protective description by using an example in which there are two connectors; when a plurality of connectors is provided, an implementation principle is the same as or similar to the implementation principle when there are two connectors, and details are not described herein again.

In addition, an embodiment of the present disclosure further provides a wire arrangement method of a printed circuit board, and the wire arrangement method of a printed circuit board includes: distributing wires of a packaged chip that are connected to different connectors on different board layers; and when the packaged chip is connected to one of the connectors, backdrilling a via to form a high-speed path from the packaged chip to the connector, and drilling out copper walls of board layers corresponding to other connectors.

Specifically, in this embodiment, the connectors include a first connector and a second connector; and a wire from the packaged chip to the first connector is disposed on a first board layer of the printed circuit board, and a wire from the packaged chip to the second connector is disposed on a second board layer of the printed circuit board.

When the packaged chip is connected to the first connector, the via is backdrilled to form a high-speed path from the packaged chip to the first connector, and a copper wall of the second board layer is drilled out; and when the packaged chip is connected to the second connector, the via is backdrilled to form a high-speed path from the packaged chip to the second connector, and a copper wall of the first board layer is drilled out.

In this embodiment, in a case that the first board layer is located below the second board layer, when the packaged chip is connected to the first connector, backdrilling of the via starts from a first layer and ends at a layer above the first board layer, and a copper wall of the second board layer is drilled out, so that the via is backdrilled to form a high-speed path from the packaged chip to the first connector, the first connector remains connected at the via, and the second connector is disconnected at the via; and when the packaged chip is connected to the second connector, backdrilling of the via starts from an $N^{th}$ layer and ends at a layer below the second board layer, and copper walls of the first board layer and a bottom layer of the printed circuit board are drilled out, so that the via is backdrilled to form a high-speed path from the packaged chip to the second connector, the second connector remains connected at the via, and the first connector is disconnected at the via, where N is a total quantity of layers of the printed circuit board.

In this embodiment, in a case that the first board layer is located above the second board layer, when the packaged chip is connected to the second connector, backdrilling of the via starts from a first layer and ends at a layer above the second board layer, and a copper wall of the first board layer is drilled out, so that the via is backdrilled to form a high-speed path from the packaged chip to the second connector, the second connector remains connected at the via, and the first connector is disconnected at the via; and when the packaged chip is connected to the first connector, backdrilling of the via starts from an $N^{th}$ layer and ends at a layer below the first board layer, and copper walls of the second board layer and a bottom layer of the printed circuit board are drilled out, so that the via is backdrilled to form a high-speed path from the packaged chip to the first connector, the first connector remains connected at the via, and the second connector is disconnected at the via, where N is a total quantity of layers of the printed circuit board.

A technical principle of the wire arrangement method of a printed circuit board is the same as a technical principle of the wire arrangement of the printed circuit board described based on FIGS. 1 to 4, and details are not described herein again.

In summary, in the present disclosure, the wires of the packaged chip that are connected to different connectors are distributed on different board layers. When the packaged chip is connected to one of the connectors, according to backdrilling of different depths, the via is backdrilled to form a high-speed path from the packaged chip to the connector, and copper walls of board layers corresponding to other connectors are drilled out. In this way, applications of high-speed wires connected to two or more connectors are met without preparing two or more printed circuit boards, thereby reducing costs. Therefore, the present disclosure effectively overcomes various defects in the related art, and has a high value in industrial use.

The above embodiments only exemplarily illustrate the principles and effects of the present disclosure, but are not used to limit the present disclosure. Any person skilled in the art may make modifications or changes to the foregoing embodiments without departing from the spirit and scope of the present disclosure. Therefore, all equivalent modifications or changes made by a person of ordinary skill in the art without departing from the spirit and technical idea of the present disclosure shall be covered by the claims of the present disclosure.

What is claimed is:

1. A printed circuit board, comprising:
a packaged chip and at least two connectors, wherein
wires of the packaged chip that are connected to different connectors are distributed on different board layers; and
when the packaged chip is connected to one of the connectors, a via is backdrilled to form a high-speed path from the packaged chip to the connector, and copper walls of board layers corresponding to other connectors are drilled out.

2. The printed circuit board as in claim 1, wherein the connectors comprise a first connector and a second connector; and a wire from the packaged chip to the first connector is disposed on a first board layer of the printed circuit board, and a wire from the packaged chip to the second connector is disposed on a second board layer of the printed circuit board.

3. The printed circuit board as in claim 2, wherein
when the packaged chip is connected to the first connector, the via is backdrilled to form a high-speed path from the packaged chip to the first connector, and a copper wall of the second board layer is drilled out; and
when the packaged chip is connected to the second connector, the via is backdrilled to form a high-speed path from the packaged chip to the second connector, and a copper wall of the first board layer is drilled out.

4. The printed circuit board as in claim 2, wherein in a case that the first board layer is located below the second board layer:
when the packaged chip is connected to the first connector, backdrilling of the via starts from a first layer and ends at a layer above the first board layer, and a copper wall of the second board layer is drilled out, so that the via is backdrilled to form a high-speed path from the packaged chip to the first connector, the first connector remains connected at the via, and the second connector is disconnected at the via; and
when the packaged chip is connected to the second connector, backdrilling of the via starts from an $N^{th}$ layer and ends at a layer below the second board layer, and copper walls of the first board layer and a bottom layer of the printed circuit board are drilled out, so that the via is backdrilled to form a high-speed path from the packaged chip to the second connector, the second connector remains connected at the via, and the first connector is disconnected at the via, wherein N is a total quantity of layers of the printed circuit board.

5. The printed circuit board as in claim 2, wherein in a case that the first board layer is located above the second board layer:
when the packaged chip is connected to the second connector, backdrilling of the via starts from a first layer and ends at a layer above the second board layer, and a copper wall of the first board layer is drilled out, so that the via is backdrilled to form a high-speed path from the packaged chip to the second connector, the second connector remains connected at the via, and the first connector is disconnected at the via; and
when the packaged chip is connected to the first connector, backdrilling of the via starts from an $N^{th}$ layer and ends at a layer below the first board layer, and copper walls of the second board layer and a bottom layer of the printed circuit board are drilled out, so that the via is backdrilled to form a high-speed path from the packaged chip to the first connector, the first connector remains connected at the via, and the second connector is disconnected at the via, wherein N is a total quantity of layers of the printed circuit board.

6. A wire arrangement method of a printed circuit board, comprising:
   distributing wires of a packaged chip that are connected to different connectors on different board layers; and
   when the packaged chip is connected to one of the connectors, backdrilling a via to form a high-speed path from the packaged chip to the connector, and drilling out copper walls of board layers corresponding to other connectors.

7. The wire arrangement method of the printed circuit board as in claim 6, wherein the connectors comprise a first connector and a second connector; and a wire from the packaged chip to the first connector is disposed on a first board layer of the printed circuit board, and a wire from the packaged chip to the second connector is disposed on a second board layer of the printed circuit board.

8. The wire arrangement method of the printed circuit board as in claim 7, wherein
   when the packaged chip is connected to the first connector, the via is backdrilled to form a high-speed path from the packaged chip to the first connector, and a copper wall of the second board layer is drilled out; and
   when the packaged chip is connected to the second connector, the via is backdrilled to form a high-speed path from the packaged chip to the second connector, and a copper wall of the first board layer is drilled out.

9. The wire arrangement method of the printed circuit board as in claim 8, wherein in a case that the first board layer is located below the second board layer:
   when the packaged chip is connected to the first connector, backdrilling of the via starts from a first layer and ends at a layer above the first board layer, and a copper wall of the second board layer is drilled out, so that the via is backdrilled to form a high-speed path from the packaged chip to the first connector, the first connector remains connected at the via, and the second connector is disconnected at the via; and
   when the packaged chip is connected to the second connector, backdrilling of the via starts from an $N^{th}$ layer and ends at a layer below the second board layer, and copper walls of the first board layer and a bottom layer of the printed circuit board are drilled out, so that the via is backdrilled to form a high-speed path from the packaged chip to the second connector, the second connector remains connected at the via, and the first connector is disconnected at the via, wherein N is a total quantity of layers of the printed circuit board.

10. The wire arrangement method of the printed circuit board as in claim 8, wherein in a case that the first board layer is located above the second board layer:
    when the packaged chip is connected to the second connector, backdrilling of the via starts from a first layer and ends at a layer above the second board layer, and a copper wall of the first board layer is drilled out, so that the via is backdrilled to form a high-speed path from the packaged chip to the second connector, the second connector remains connected at the via, and the first connector is disconnected at the via; and
    when the packaged chip is connected to the first connector, backdrilling of the via starts from an $N^{th}$ layer and ends at a layer below the first board layer, and copper walls of the second board layer and a bottom layer of the printed circuit board are drilled out, so that the via is backdrilled to form a high-speed path from the packaged chip to the first connector, the first connector remains connected at the via, and the second connector is disconnected at the via, wherein N is a total quantity of layers of the printed circuit board.

* * * * *